United States Patent [19]

Tomczak et al.

[11] 4,191,899

[45] Mar. 4, 1980

[54] VOLTAGE VARIABLE INTEGRATED CIRCUIT CAPACITOR AND BOOTSTRAP DRIVER CIRCUIT

[75] Inventors: James J. Tomczak, Burlington; Richard N. Wilson, Essex Junction, both of Vt.

[73] Assignee: International Business Machines Corporation, Armonk, N.Y.

[21] Appl. No.: 811,028

[22] Filed: Jun. 29, 1977

[51] Int. Cl.² .................... H03K 19/08; H03K 19/36; H01L 29/92
[52] U.S. Cl. .................................. 307/303; 307/320; 307/215; 307/270; 357/14
[58] Field of Search ............... 307/215, 270, 303, 320; 357/14; 328/176

[56] References Cited

U.S. PATENT DOCUMENTS 3,654,498  4/1972  Chapron .......................... 357/14 X

*Primary Examiner*—John Zazworsky
*Attorney, Agent, or Firm*—Howard J. Walter, Jr.

[57] ABSTRACT

An integrated circuit junction capacitor is formed using conventional bipolar transistor technology. Voltage variable capacitance is provided by a reverse biased emitter-base junction and parasitic collector-base capacitance is isolated from the emitter-base capacitance by maintaining the base-collector junction in a reverse biased condition. A bootstrapped driver circuit is also described in which bootstrap current is provided by a transistor-like structure in which an internal load capacitance enables circuit performance to remain substantially constant under various driven load conditions.

10 Claims, 10 Drawing Figures

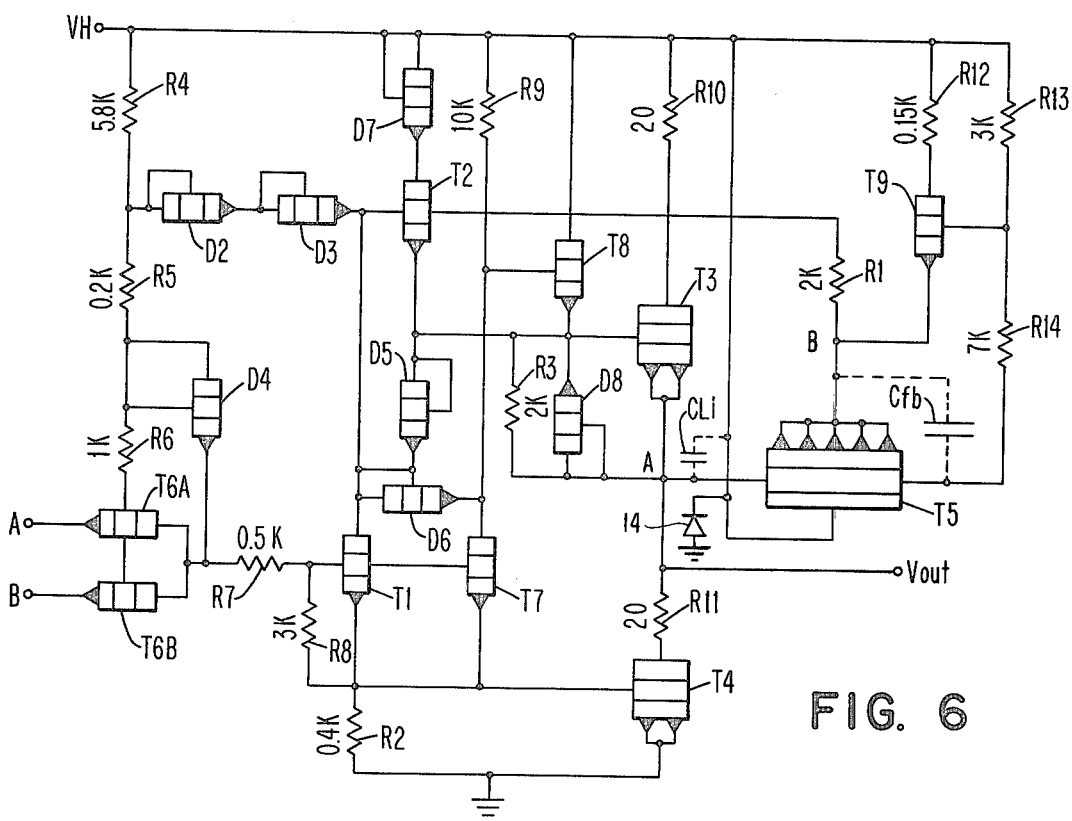
FIG. 6
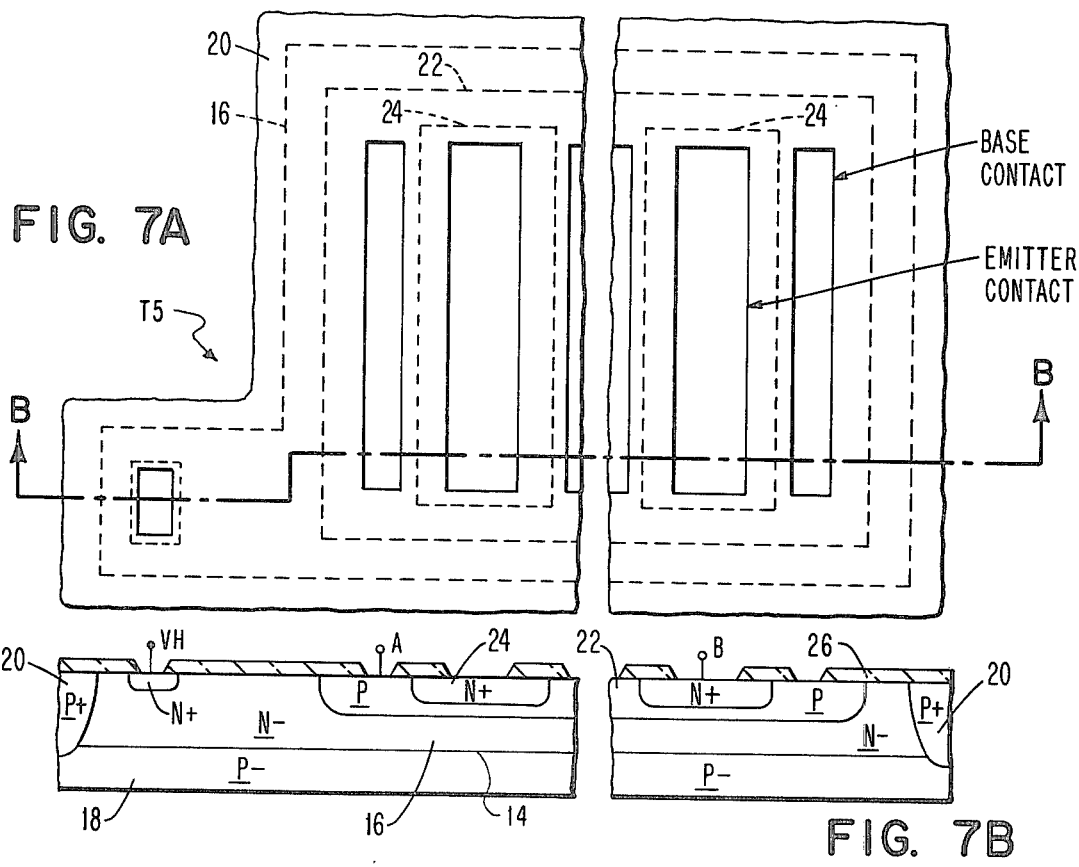
FIG. 7A
FIG. 7B

VOLTAGE VARIABLE INTEGRATED CIRCUIT CAPACITOR AND BOOTSTRAP DRIVER CIRCUIT

BACKGROUND OF THE INVENTION

1. Field of the Invention

This invention relates to integrated circuit technology and more particularly to capacitive integrated circuit elements and their use in bipolar integrated circuit applications.

2. Description of the Prior Art

In the design of digital systems it is often found that two different integrated circuit technologies, such as bipolar and field effect, are required to obtain overall system performance objectives. For example, it is well known to utilize bipolar circuitry for logic and clock driving applications and field effect circuitry for memory applications. Since bipolar circuitry normally operates at voltages considerably less than required for operating field effect circuitry buffer circuits are required to boost bipolar signal levels to field effect levels. Specific implementations usually use bipolar circuitry to provide the buffer function.

Because field effect circuitry is particularly prone to provide voltage drops of one threshold voltage (typically 0.5 to 1.5 volts) per logic stage, it is important that field effect input signals be as close as possible to the drain supply potential of the field effect circuits used (typically 8 to 15 volts). Emitter follower circuits are used almost exclusively, and to eliminate or reduce the base/emitter drop inherent in such circuits, some form of capacitive charge retention or bootstrapping element is used. For example, U.S. Pat. No. 3,656,004 to Kemerer et al, entitled "Bipolar Capacitor Driver," utilizes the built-in base/emitter capacitance itself to provide additional stored charge to maintain the output emitter follower device conductive for a sufficient time after the base driver circuit becomes non-conductive so that the output voltage approaches the supply potential. The article "Bipolar Bootstrap Circuit," by H. Schettler, IBM Technical Disclosure Bulletin, February 1976, pages 2818–2819, teaches a similar charge storage technique in which the base/collector capacitance of a bipolar transistor is used to provide additional current to sustain the driver device conductive after its driving source has been turned off. In both examples, the amount of charge capable of being retained is limited by large parasitic capacitances from device elements to the integrated circuit substrate and by the time required to charge the internal capacitances after the output begins to rise.

The article, "Dynamic MOSFET Shift Register Array Clock Driver," by E. Seewann, IBM Technical Disclosure Bulletin, February 1974, pages 2767–2768 and U.S. Pat. No. 4,002,931 to Tsang et al, entitled "Integrated Circuit Bipolar Bootstrap Driver," utilize a bootstrap capacitance coupled from the emitter follower output to its input to provide a boosted voltage level to maintain the output device conductive after the input to the driver would ordinarily cease. FIG. 1 illustrates a simplified driver of the bootstrap type in which an input signal is applied to T1 and an inverted output signal Vout produced at voltage node A. When Vin is a high level logic signal T1 conducts causing T4 to conduct discharging node A to ground. When T1 is conducting, the base of T2 is near ground and T2 is off. The voltage drop across R1 enables feedback capacitor Cfb to charge to approximately VL minus the Vbe of diode D1. When the input changes from its high to its low logic state, T1 and T4 are turned off. The base of T2 begins to rise causing T2 to turn on and, in turn, T3 begins to conduct allowing the output Vout to rise. The rate at which node A rises is determined by the size of the capacitive load (not shown) being driven, the size of Cfb and the size of various parasitic capacitances, shown as lumped variable capacitance Cp. The larger Cp becomes, the larger Cfb must be to provide sufficient feedback to node B to supply current to the base of T2 to sustain its conduction until node A reaches the drain supply potential VH. In many instances, Cfb is too large to be included on the same substrate as the remainder of the circuit and is provided as a discrete external component. The above mentioned Tsang et al patent describes an integrated thin oxide capacitor as shown in FIG. 2. As shown, the output, node A, is ohmically connected to an N+ doped semiconductor region with the P+ isolated pocket formed in the N type epitaxial layer grown on a P− substrate. Note that although the capacitance Cfb between contacts A and B is constant, the capacitance between contact A and the substrate comprises a reverse biased p-n junction 8. FIG. 3A is a schematic representation of the capacitor shown in FIG. 2 while FIG. 3B is a representation of the capacitive effects of the capacitor when node A is rising. The reverse biased diode characteristics correspond to a variable capacitor Cp in which capacitance decreases as node A rises. Because the ratio of Cfb to Cp may be small, the efficiency of the feedback effect may be reduced. Although other capacitive structures, such as junction capacitors, see for example U.S. Pat. No. 3,474,309 to Stehlin, may be suggested, these too have very large parasitic capacitances coupled to the capacitor terminals which decrease the efficiency of the circuit.

Additional references which may be considered pertinent include: U.S. Pat. No. 3,641,368 to Gamble et al which illustrates the use of an NPN transistor having a shorted collector-emitter to form a circuit capacitance and U.S. Pat. No. 3,678,348 to Reber et al which shows a multi-emitter bipolar transistor having a plurality of contacts commonly coupled to a single emitter electrode and a separate multiple contact base electrode.

SUMMARY OF THE INVENTION

The principle object of the subject invention is to provide improved performance of integrated bipolar circuits utilizing capacitive feedback elements.

Another object is to provide an improved bipolar capacitance structure capable of reducing the effects of parasitic capacitance to bipolar circuit performance.

The subject invention provides improvement in bipolar transistor technology by the use of a multi-junction voltage variable capacitance device which includes three serially connected p-n junctions connected between a reference potential and an output terminal in which the center p-n junction is oppositely poled from the remaining two junctions. By maintaining all of the junctions in a reverse biased condition, an input signal coupled between the two junctions nearest the output terminal provides a voltage variable capacitance between the input signal and the output terminal while the center p-n junction provides capacitive isolation between the input signal and the reference potential. Use of the voltage variable capacitance as a bootstrap capacitor in a bipolar driven circuit provides a circuit having a broad range of operating conditions primarily due to the bult-in load capacitance provided by the capacitance provided by the center p-n junction to the input signal.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 6 is a schematic circuit diagram of another embodiment of a bootstrap bipolar driver circuit of the invention.

FIG. 7A is a plan view of an embodiment of the capacitor showing the multiple emitter-like and baselike contact regions of the capacitive element T5 shown in FIG. 6.

FIG. 7B is a cross-sectional view of the capacitor of FIG. 7A taken along the line B—B and shows the vertical profile of the structure.

DESCRIPTION OF THE PREFERRED EMBODIMENTS

Figure 4:
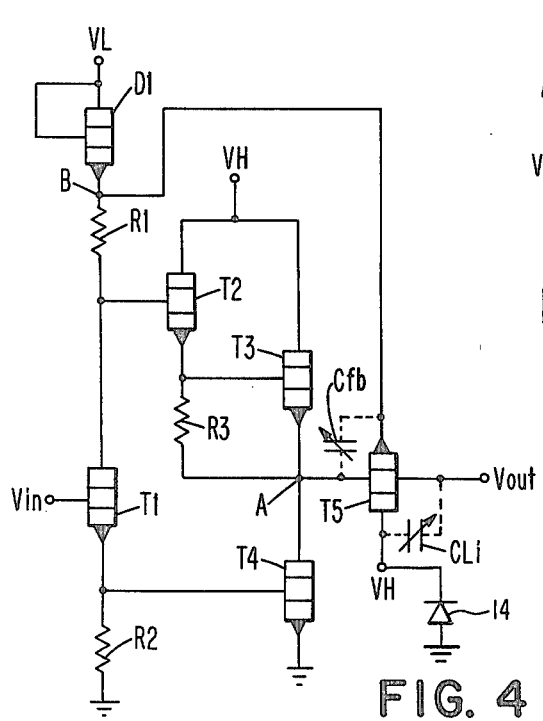
FIG. 4 is a schematic circuit diagram of a bootstrap bipolar driver circuit in which the capacitor of the invention is illustrated as a bipolar transistor.

Referring to FIG. 4, there is shown an embodiment of the instant invention in the form of a bootstrap bipolar driver circuit including an emitter follower of the Darlington type. The circuit is designed to respond to an input signal Vin provided from bipolar logic circuitry and to provide an output Vout having voltage levels between circuit ground and the drain supply voltage VH of a driven field effect transistor (FET) circuit. The circuit comprises input device T1 having its base coupled to Vin and its collector coupled to the input of Darlington amplifier pair T2 and T3. The emitter of T1 is coupled through resistor R2 to ground and is directly connected to the base of output pull down device T4. The collector of T1 is also coupled through diode connected transistor D1 and resistor R1 to a low level biasing potential VL. The amplifier or driver portion of the circuit comprises T2 and T3 having their collectors coupled to FET drain supply potential VH. The output of the amplifier is connected at Voltage node A to the collector of pull down device T4. Coupled between node A and output terminal Vout is an NPN bipolar transistor-like device T5 which has its base common to node A and Vout. The collector of T5 is connected to VH and the emitter is coupled to voltage node B between R1 and D1. The biasing of T5 is such that it does not exhibit transistor action but acts only as a pair of junction capacitors coupling the output Vout to node B via feedback capacitance Cfb and coupling Vout to VH via internal load capacitance CLi.

In operation, the circuit of FIG. 4 operates as follows. When Vin is at its high logic level, T1 is rendered conductive and current flows from VL through D1, R1, T1 and R2 to ground. Current through R2 causes the base of T4 to rise above Vbe of T4 turning T4 on which clamps node A, and Vout, to ground. The voltage divider action of D1, R1 and R2 causes the base potential of T2 to be low enough that T2 and T3 are non-conductive. Node B, however, is maintained at a voltage equal to about VL-Vbe of D1 which causes the emitter/base junction of T5 to be reverse biased and charges Cfb. The collector of T5 being connected to VH provides a reverse bias on the collector/base junction charging CLi.

Figure 1:
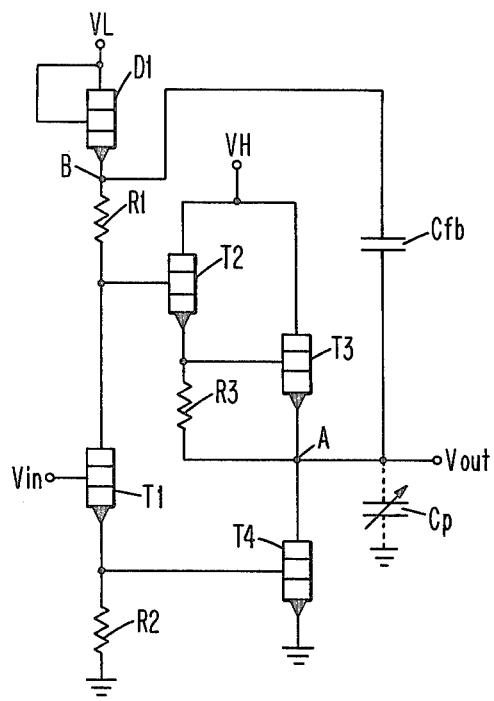
FIG. 1 is a schematic circuit diagram of a bootstrap bipolar driver circuit as described in the prior art.
Figure 2:
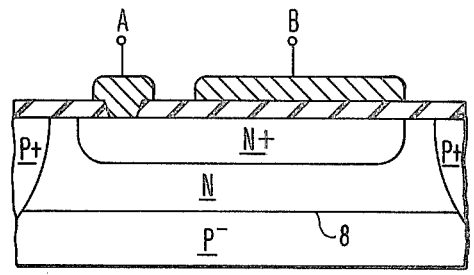
FIG. 2 is a cross-sectional schematic drawing of a capacitor structure as described in the prior art.
Figure 3A:
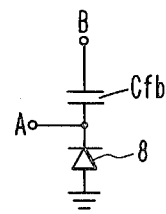
FIGS. 3A and 3B are schematic circuit diagrams showing two different electrical schematic drawings of the capacitor shown in FIG. 2.
Figure 3B:
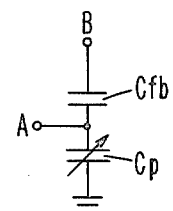

When Vin goes low, T1 turns off which causes T4 to turn off removing the clamping effect of T4 on the output. When T1 ceases to conduct, the base potential on T2 rises causing both T2 and T3 to turn on enabling node A and Vout to rise toward VH. Assuming for a moment that T5 is not present, transistor action of T2 would be limited when the node A was approximately two to three Vbe voltage drops below VL as R1 would not be able to supply current to the base of T2 when the voltage difference across R1 becomes zero. In the present circuit, the precharge voltage on Cfb is capacitively coupled to node B which rises to Vout plus its precharge voltage (VL-Vbe) causing node B to rise considerably above its precharge potential of VL-Vbe. The increase in voltage enables T2 and T3 to remain conductive until Vout rises to substantially VH, the desired result. At the time Vout is rising, internal load capacitance CLi, formed by the reverse biasing of the collector/base junction of T5, acts as an output rise time limiter. As will be discussed below, the ratio of Cfb and CLi can be adjusted in the fabrication process to provide both the desired feedback response and the desired internal load capacitance. Note that the present circuit, unlike that of the prior art (FIG. 1), does not contain the relatively large parasitic capacitance Cp between the output and ground.

Figure 5A:
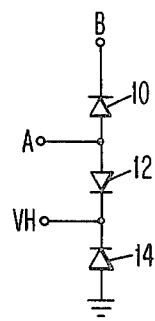
FIGS. 5A and 5B are schematic circuit diagrams showing alternative electrical circuit configurations of the capacitor device of FIG. 4.

FIG. 5A is a representation of the diode characteristics of capacitive device T5 illustrating the serially connected diodes representing the emitter/base diode 10, the base/collector diode 12 and the collector/isolation diode 14. Note that all three junctions are maintained in a reverse biased condition. Diode 10 is initially biased with terminal B at VL-Vbe and terminal A at zero volts. Diode 12 being biased between VH and zero volts and isolation/collector diode 14 biased permanently with VH and zero volts. When Vout rises, diode 10 remains reverse biased as terminal B is capacitively coupled to remain higher than terminal A and diode 12 is biased at VH less Vout.

Figure 5B:
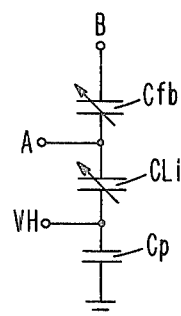

FIG. 5B is a schematic diagram illustrating the purely capacitive effect that T5 provides between nodes A and B. Note that Cfb and CLi are represented as variable capacitances since they are formed by reverse biased p-n junctions experiencing different reverse bias conditions. Collector/isolation diode 14 of FIG. 5A is represented as a fixed capacitance Cp and effectively has no influence on the operation of the circuit. In cases where Cp, as depicted in FIG. 5B, is large, note that Cp does not influence the effect of bootstrap capacitor Cfb.

Referring now to FIG. 6, there is shown a second embodiment of the invention in the form of a two-input NAND driver circuit. Corresponding reference numbers have been used in FIG. 6 for corresponding elements found in FIG. 4 having similar functions. The circuit is comprised of a two-input AND gate having inputs A and B coupled to the to the emitters of devices T6A and T6B. Transistor-diode D4 coupled between the base and collector of T6A and T6B prevents them from going into deep saturation. The collectors of T6A and T6B are coupled through resistor R7 to the bases of T1 and T7. The emitters of T1 and T7 are connected to the base of pull-down device T4. The collector of T1 is connected to the input of amplifying device T2, as well as to diodes D2 and D3, which are coupled to VH through R4 to prevent the deep saturation of T1. The emitter of T2 is coupled to the base of output driver T3 which, in turn, has its emitter connected to the output Vout. The collector of T7 is coupled to the base of T8 which has its emitter connected to the base of T3 to provide additional drive current for T3. Current for driving T2 is provided by the combination of T9, R1, R12 and R13, all of which are functionally equivalent to D1 and R1 of FIG. 4. Device T5 provides the voltage variable capacitances Cfb and CLi coupled to the output at the emitter of T3. In order to provide the desirable performance characteristics, T5 is fabricated as a five emitter bipolar device having multiple base contacts as described below. Diode connected devices D8, D5 and D6 aid in providing current to T4 through T1 and T7 when the output is being driven from VH toward ground. Diode D7 prevents T2 from going into deep saturation.

In operation, the circuit of FIG. 6 operates in a manner similar to that of FIG. 4 with the addition of the logic AND gate to the input. When either or both input A and/or B are at a low logic level (zero volts), either T6A or T6B, or both, are conductive causing the base of T1 and T7 to be referenced to a point near ground (zero volts). T1 and T7 being non-conductive causes T4 to be non-conductive. The output Vout will at this time already have been driven to substantially VH and remains at that potential until both of the inputs A and B are returned to a high logic state. When both inputs A and B are sufficiently high such that devices T6A and T6B stop conducting the base potential of T1 and T7 rises and turns on T1 and T7. Current is provided through T1 and T7 to the base of T4 turning T4 on and enabling Vout to be pulled toward ground. Diodes D8, D5 and D6, along with T1 and T7, provide additional current to T4 depending upon the loading of the output terminal. Diode D6 coupled between the collectors of T1 and T7 acts as an equalizer of the collector currents of these devices.

When the output Vout is at ground potential, T2 and T3 are non-conductive. Resistor divider R13 and R14 are now coupled between VH and ground (through the base of T5) and the potential at the base of T9 causes T9 to conduct thus charging the multiple emitters of T5 to a potential of about one Vbe drop below the potential determined by the resistor divider R13 and R14. Thus, feedback capacitance Cfb is charged to this same potential. At the same time, internal load capacitance CLi is charged to VH. When either one or both of the inputs A and/or B again falls sufficiently to cause T6A or T6B to conduct, thus turning off T1, T7 and T4, the bases of both T2 and T8 will rise toward VH to turn on T2 and T8, thus turning on T3, and enabling Vout to rise. As described previously, the rising of Vout causes the reverse biased emitters of T5 to be capacitively coupled to a sufficiently high potential to provide current to T2 until Vout rises to VH. When the multiple emitters of T5 begin to rise, T9 becomes non-conductive as its emitter will be at a higher potential than its base.

Referring now to FIGS. 7A and 7B, there is shown the structure of device T5 as integrated in the circuit of FIG. 6 in which a common process is used for all of the transistors. The capacitive element is formed in an isolated diffusion pocket 16 of N— type epitaxial silicon grown on a P— substrate 18 and bounded by isolation region 20. The diffusion pocket is substantially identical to those used for the other bipolar devices on the chip. Although the remainder of the transistor structures on the substrate use a burried N+ subcollector, none is utilized in the capacitive device structure in order to reduce pipe defect density to a minimum and to provide maximum collector resistance. For the same reason the collector contact is placed on an extension of the pocket 16. Diffused within pocket 16 is a single base region 22 of P— type conductivity and within base region 22 are a plurality of, for example five, emitter regions 24. A suitable insulation layer 26 covers the surface of the device except where contact holes are provided which enable an overlying conductive layer, not shown, to make ohmic contact to the various portions of the semiconductor substrate as shown. All of the emitter regions are connected to a common conductor having finger-like projections extending along the length of the emitter regions 24. In a similar manner, multiple contacts, for example six, are provided to contact the base region 22.

Increasing or decreasing the number and size, i.e.: junction area, of the emitter regions enables the capacitance of feedback capacitance Cfb to be varied. Note that Cfb can be varied substantially with little or no increase in the capacitance provided by the base to collector junction such that the ratio of Cfb to CLi may also be adjusted. Since the collector region 16 is connected directly to VH, the normally large collector 16 to isolation 20 capacitance and collector 16 to substrate 18 capacitance is isolated from the active terminals of the device.

While the invention has been described in terms of NPN transistors, those skilled in the art will recognize that PNP transistors may be substituted therefore by observing normal substitution ground rules well known in the art. It will also be understood that although the capacitive device described as T5 has been illustrated in designated symbolic elements of a bipolar transistor this designation has been selected primarily in view of the structurally similar elements of the device to conventional bipolar transistors. It will be understood that the device T5 does not operate under conditions which produce transistor action.

Although the invention has been particularly shown and described with reference to preferred embodiments thereof, it will be understood by those skilled in the art that the foregoing and other changes in form and detail may be made therein without departing from the spirit and scope of the invention.

What is claimed is:

1. A voltage variable integrated capacitor comprising:
    three p-n junction diodes serially connected between a reference potential and a voltage node, the center one of said p-n junction diodes being oppositely poled with respect to the remaining two of said p-n junction diodes;
    input means for coupling an input signal to a point between said p-n junction diode nearest said voltage node and said center p-n junction diode; and biasing means coupled to said diodes for maintaining all three of said diodes in a reverse biased condition, said p-n junction diode nearest said voltage node providing a capacitively coupled output signal to said voltage node in response to an input signal.

2. The capacitor of claim 1 wherein said three pn junction diodes are formed on a single integrated circuit chip and the diode nearest said reference potential comprises an isolation junction and said biasing means comprises a fixed potential.

3. The capacitor of claim 2 wherein said p-n junction diode nearest said voltage node comprises an emitter-like region and a base-like region of a bipolar transistor-like structure.

4. In an integrated circuit, the combination comprising:
   a semiconductor substrate of a first conductivity type;
   a first region of a second conductivity type formed on a surface of said substrate, said first region being bounded by a first p-n junction;
   a second region of said first conductivity type formed in said first region, said second region being bounded by a second p-n junction;
   a third region of said second conductivity type formed in said second region, said third region being bounded by a third p-n junction;
   first terminal means connected to said second region for receiving an input voltage signal;
   second terminal means connected to said third region for providing a capacitively coupled output signal; and
   biasing means for maintaining the p-n junctions formed between said substrate and said first region and between said first region and said second region in a reverse biased condition to provide electrical isolation between said second region and said substrate and to provide capacitive coupling of a portion of said input signal from said first terminal means to said second terminal means.

5. The integrated circuit of claim 4 wherein said biasing means comprises means to apply a supply potential to said first region and a reference potential to said substrate.

6. An integrated bipolar bootstrap circuit formed on a semiconductor substrate comprising:

at least one bipolar amplifier stage having an input and an output; and
feedback means comprising a resistor and a capacitor, said capacitor being formed in a p-n junction-isolated region of said substrate and including a first capacitor terminal directly coupled to said output and being capacitively coupled to said p-n junction-isolated region through a reverse biased first p-n junction, said capacitor also including a second capacitor terminal connected to said resistor and being electrically coupled to said first capacitor terminal through a reverse biased second p-n junction.

7. The integrated circuit of claim 6 wherein said amplifier stage comprises an emitter follower circuit.

8. The integrated circuit of claim 7 wherein said second capacitor terminal is coupled to a common current source for providing current to charge said second terminal and to provide current to said amplifier stage.

9. The integrated circuit of claim 8 wherein said capacitor comprises a bipolar transistor-like structure including a plurality of emitter-like regions forming said reverse biased second p-n junction with a base-like region, and said base-like region and a collector-like region forming said reverse biased first p-n junction.

10. In a p-n junction isolated bipolar drive integrated circuit comprising:
    a semiconductor substrate;
    an amplifier driver stage having an input and an output and being formed in said substrate;
    a first p-n junction capacitor having two terminals formed in a p-n junction isolated region on said substrate, said first capacitor being coupled between the input and the output of said amplifier drive stage, the terminals of said first capacitor being electrically isolated from said substrate by at least one reverse biased p-n junction, and
    a second p-n junction capacitor having two terminals formed in said p-n junction isolated region on said substrate, said second capacitor being coupled between the output of said amplifier drive stage and a fixed potential source, the terminals of said second capacitor being electrically isolated from said substrate by said at least one reverse biased p-n junction.

* * * * *